United States Patent
Cai et al.

(10) Patent No.: US 11,406,041 B1
(45) Date of Patent: Aug. 2, 2022

(54) MODULAR LIQUID COOLING ASSEMBLY

(71) Applicant: Amazon Technologies, Inc., Seattle, WA (US)

(72) Inventors: Steve Qingjun Cai, Newbury Park, CA (US); Unnikrishnan Vadakkanmaruveedu, Chandler, AZ (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/831,411

(22) Filed: Mar. 26, 2020

(51) Int. Cl.
H05K 7/20 (2006.01)
G06F 1/20 (2006.01)
F28D 15/00 (2006.01)

(52) U.S. Cl.
CPC ......... *H05K 7/20272* (2013.01); *F28D 15/00* (2013.01); *G06F 1/206* (2013.01); *H05K 7/20281* (2013.01); *H05K 7/20772* (2013.01); *H05K 7/20836* (2013.01)

(58) Field of Classification Search
CPC .......... H05K 7/20272; H05K 7/20281; H05K 7/20772; H05K 7/20836; F28D 15/00; G06F 1/206
See application file for complete search history.

(56) References Cited

U.S. PATENT DOCUMENTS

| | | | | |
|---|---|---|---|---|
| 7,372,698 | B1* | 5/2008 | Tilton | H05K 7/20772 165/104.33 |
| 7,450,385 | B1* | 11/2008 | Campbell | H05K 7/20772 165/80.4 |
| 7,515,418 | B2* | 4/2009 | Straznicky | H01L 23/4338 361/699 |
| 10,014,239 | B2* | 7/2018 | Takemura | H05K 7/20509 |
| 10,136,554 | B2* | 11/2018 | Chainer | G05D 23/1919 |
| 10,244,655 | B2* | 3/2019 | Chainer | H05K 7/20318 |
| 10,455,733 | B2* | 10/2019 | Gardoni | H05K 7/20763 |
| 10,499,543 | B2* | 12/2019 | Chainer | G06F 1/20 |
| 10,701,832 | B2* | 6/2020 | Chainer | G06F 1/206 |
| 10,966,354 | B1* | 3/2021 | Shao | H01L 23/473 |
| 11,019,752 | B2* | 5/2021 | Gao | H05K 7/20254 |
| 2012/0137718 | A1* | 6/2012 | Uchida | F28D 15/043 62/259.2 |
| 2018/0270989 | A1* | 9/2018 | Chainer | G06F 1/206 |

FOREIGN PATENT DOCUMENTS

WO    WO-2017207048 A1 * 12/2017   ......... H05K 7/20218

* cited by examiner

*Primary Examiner* — Robert J Hoffberg
(74) *Attorney, Agent, or Firm* — Kilpatrick Townsend & Stockton LLP (57) ABSTRACT

An electronic system includes a chassis, a liquid coolant supply line assembly, a first electronic subassembly, a second electronic subassembly, and a liquid coolant return line assembly. The liquid coolant supply line assembly includes a coolant supply line configured to receive and convey liquid coolant. The first electronic subassembly includes a first electronic component and a first cooling loop to transfer heat from the first electronic component into the liquid coolant. The second electronic subassembly includes a second electronic component and a second cooling loop to transfer heat from the second electronic component into the liquid coolant. The liquid coolant return line assembly includes a coolant return line to receive liquid coolant from the first and second cooling loops.

17 Claims, 6 Drawing Sheets

MODULAR LIQUID COOLING ASSEMBLY

BACKGROUND

Many electronic systems include electronic components that generate sufficient heat so that cooling of the electronic components is employed. For example, a datacenter typically contains a collection of computer servers and components for the management, operation and connectivity of those servers. Even in isolation, datacenter electronic components may generate sufficient heat that temperature management is important to prolong the life of the components and to allow smooth and continuous operation of the datacenter. Datacenter electronic components are often arranged together. For example, datacenter electronic components can be vertically arranged in racks or within server cabinets. When heat-generating electronic components are arranged together, however, the cumulative generation of heat can increase the ambient temperature and exacerbate the challenge of managing the temperature of individual components.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Modular cooling assemblies, and related methods, for cooling of electronic systems (e.g. a computer(s), a computer server(s), and the like) are presented. In many embodiments, a modular cooling assembly employs a cooling fluid (e.g., a di-electric liquid) transported through a liquid coolant supply line assembly to separate cooling loops configured to cool a particular electronic component or electronic subassembly. The liquid coolant flows through the separate cooling loops to a liquid coolant return line assembly for transport to a heat exchanger for removal of heat from the liquid coolant prior to recirculation of the liquid coolant back to the liquid coolant supply line assembly. In many embodiments, the liquid coolant supply line assembly includes a coolant supply line and supply-line plug-in connectors distributed along the coolant supply line. In many embodiments, the liquid coolant return line assembly includes a coolant return line and return-line plug-in connectors distributed along the coolant return line. Any suitable pair of one of the supply-line plug-in connectors and one of the return-line plug-in connectors can be used to connect a separate cooling loop between the liquid coolant supply line and the liquid coolant return line for transport of a flow of the liquid coolant through the separate cooling loop. The separate cooling loops can be used for cooling of any suitable component including, but not limited to, a card(s), a central processing unit(s), a hard disk drive(s), a motherboard(s). In many embodiments, any suitable number of additional separate cooling loops can be selectively added and/or any suitable number of the separate cooling loops can be selectively decoupled based on specific cooling needs and/or goals. In many embodiments, the liquid coolant supply line assembly and the liquid coolant return line assembly are configured to accommodate various arrangements and configurations of electronic components, thereby reducing expense via increased standardization of the modular cooling assemblies. In many embodiments, a pump is used to circulate the liquid coolant through the modular cooling assembly including through the liquid supply line, the separate cooling loops, the liquid return line, and the heat exchanger.

Figure 1:
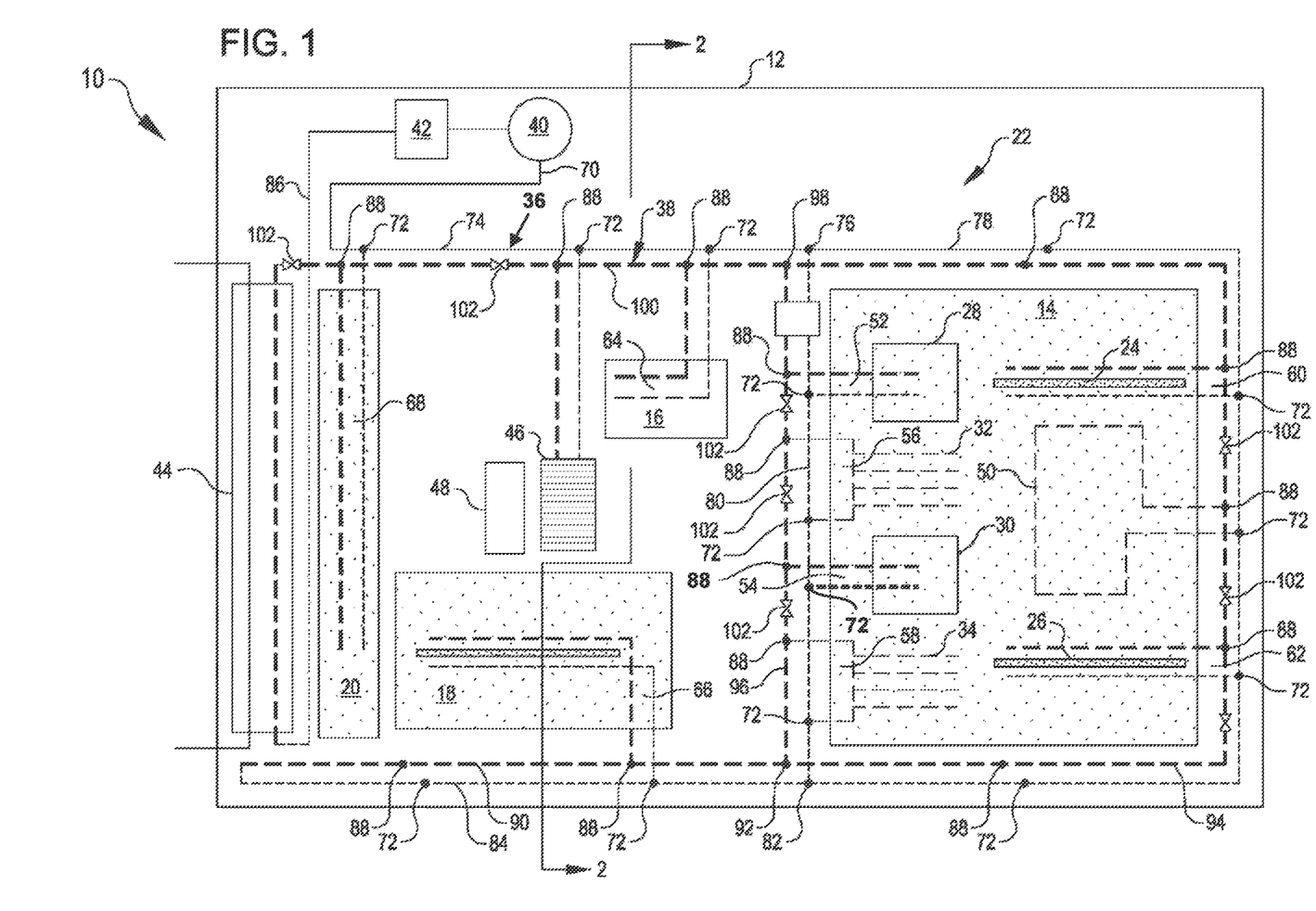
FIG. 1 is a plan view schematic illustration of a computer system that includes a modular cooling assembly, in accordance with various embodiments.

Turning now to the drawing figures in which similarly-labeled features in the various figures refer to similar features, FIG. 1 is a plan view schematic illustration of a computer system 10 that includes a chassis 12, a motherboard 14, a hard disk drive (HDD) 16, an interposer 18, a power distribution board (PDB) 20, and a modular cooling assembly 22, in accordance with various embodiments. The motherboard 14 includes a first riser circuit board 24, a second riser circuit board 26, a first processing unit 28, a second processing unit 30, a first memory bank 32, and a second memory bank 34. Each of the motherboard 14, the HDD 16, the interposer 18, the PDB 20, and the modular cooling assembly 22 is mounted to the chassis 12.

The modular cooling assembly 22 is configured to remove heat generated by components of the computer system 10. Each of the motherboard 14, the HDD 16, the interposer 18, and the PDB 20 are cooled by the modular cooling assembly 22 via dedicated liquid cooling circuits. The modular cooling assembly 22 includes a coolant supply line assembly 36, a coolant return line assembly 38, a liquid pump 40, a bubble filtration unit 42, an external heat exchanger 44, an internal liquid to air heat exchanger 46, and an internal fan 48. The dedicated liquid cooling circuits include a motherboard cooling circuit 50, a first processor cooling circuit 52, a second processor cooling circuit 54, a first memory bank cooling circuit 56, a second memory bank cooling circuit 58, a first riser cooling circuit 60, a second riser cooling circuit 62, a HDD cooling circuit 64, an interposer cooling circuit 66, and a PDB cooling circuit 68. Each of the dedicated cooling circuits receives a flow of liquid coolant from the coolant supply line assembly 36, transfers heat from the respective component being cooled into the respective flow of liquid coolant, and transfers the respective heated flow of liquid coolant to the coolant return line assembly 38.

Figure 9:
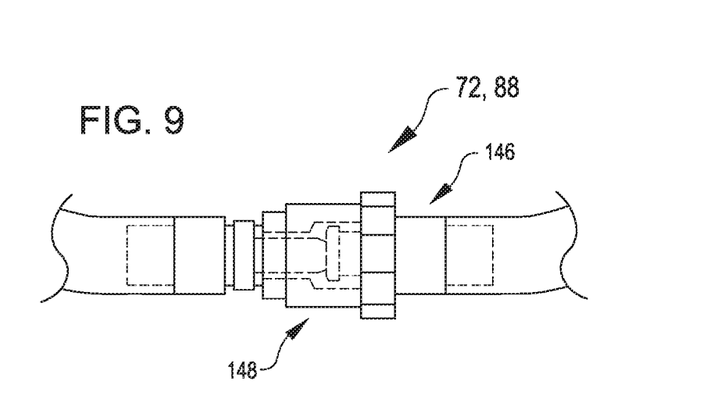
FIG. 9 is a side view illustration of cooling line connectors of the modular cooling assembly of the computer system of FIG. 1.

The coolant supply line assembly 36 includes a coolant supply line 70 and supply-line plug-in connectors 72. The coolant supply line 70 is mounted to the chassis 12 and extends around a perimeter portion of the chassis 12 and extends across an interior portion of the chassis 12. The coolant supply line 70 includes an upstream supply line segment 74, an upstream supply line branch 76, a first midstream supply line segment 78, a second midstream supply line segment 80, and a downstream supply line branch 82, and a downstream supply line segment 84. The upstream supply line segment 74 conveys liquid coolant to the upstream supply line branch 76. The upstream supply line branch 76 distributes liquid coolant to the first midstream supply line segment 78 and the second midstream supply line segment 80. The downstream supply line branch 82 combines liquid coolant received from the first midstream supply line segment 78 with liquid coolant received from the second midstream supply line segment 80 and supplies the combined liquid coolant to the downstream supply line segment 84. The supply-line plug-in connectors 72 are distributed along the coolant supply line 70 for connection to the dedicated cooling circuits for transfer of respective flows of the liquid coolant from the coolant supply line 70 to each of the dedicated cooling circuits. The supply-line plug-in connectors 72 can have any configuration suitable for fluidly coupling the dedicated cooling circuits to the coolant supply line 70. For example, in some embodiments, the supply-line plug-in connectors 72 have a quick-coupler configuration as illustrated in FIG. 9.

The coolant return line assembly 38 includes a coolant return line 86 and return-line plug-in connectors 88. The coolant return line 86 is mounted to the chassis 12 and extends around a perimeter portion of the chassis 12 and extends across an interior portion of the chassis 12. The coolant return line 86 includes an upstream return line segment 90, an upstream return line branch 92, a first midstream return line segment 94, a second midstream return line segment 96, a downstream return line branch 98, and a downstream return line segment 100. The upstream return line segment 90 conveys liquid coolant to the upstream return line branch 92. The upstream return line branch 92 distributes liquid coolant to the first midstream return line segment 94 and the second midstream return line segment 96. The downstream return line branch 98 combines liquid coolant received from the first midstream return line segment 94 with liquid coolant received from the second midstream return line segment 96 and supplies the combined liquid coolant to the downstream return line segment 100. The return-line plug-in connectors 88 are distributed along the coolant return line 86 for connection to the dedicated cooling circuits for transfer of respective flows of the liquid coolant from each of the dedicated cooling circuits to the coolant return line 86. The return-line plug-in connectors 88 can have any configuration suitable for fluidly coupling the dedicated cooling circuits to the coolant return line 86. For example, in some embodiments, the return-line plug-in connectors 88 have a quick-coupler configuration as illustrated in FIG. 9.

In many embodiments, the modular cooling assembly 22 includes flow control elements that are employed to control rate of flow of the liquid coolant through each of the dedicated cooling circuits. Any suitable combination of flow control elements can be employed. For example, in the illustrated embodiment, the flow control elements include the liquid pump 40 and flow rate control valves 102. The liquid pump 40 can be configured and operated to pump the liquid coolant through the coolant supply line 70 at a suitable rate for supplying respective flow rates of the liquid coolant to each of the dedicated cooling circuits. The flow rate control valves 102 can be configured and/or controlled to control distribution of a suitable portion of the flow rate of the liquid coolant supplied to the coolant supply line 70 by the pump 40 to each of the dedicated cooling circuits. The flow rate control valves 102 can have any suitable distribution and position within the modular cooling assembly 22. For example, in the illustrated embodiment, the flow rate control valves 102 are incorporated into the coolant return line assembly 38 and positioned along the coolant return line 86 between adjacent pairs of the dedicated cooling circuits to enable control of the flow rate of the coolant through each of the dedicated cooling circuits via control of the resulting flow rates through the adjacent segments of the coolant return line 86. The flow rate control valves 102 can have any suitable configuration for controlling flow rate through the valve including, for example, a configuration having a pre-set resistance to flow rate, a configuration producing a pre-determined flow rate, a configuration that is adjustable to provide an selectable resistance to flow rate, a configuration that is adjustable to produce a selected flow rate, and a controllable configuration that can be actively controlled via a control signal (e.g., an electric control signal) generated based on a temperature signal generated by a temperature sensor sensing a temperature of the component cooled by the respective cooling circuit to adjust flow rate through the cooling circuit to control the temperature of the cooled component within a desired operating temperature range.

In operation, the liquid coolant pump 40 recirculates the liquid coolant through the modular cooling assembly 22. In the illustrated embodiment, the pump 40 pumps a flow of the liquid coolant through the upstream supply line segment 74. The upstream supply line segment 74 supplies liquid coolant to the HDD cooling circuit 64. Downstream of the HDD cooling circuit 64, the upstream supply line branch 76 distributes liquid coolant received from the upstream supply line segment 74 to the first midstream supply line segment 78 and the second midstream supply line segment 80. The first midstream supply line segment 78 distributes liquid coolant to the first riser cooling circuit 60, the motherboard cooling circuit 50, and the second riser cooling circuit 62. The second midstream supply line segment 80 distributes liquid coolant to the first processor cooling circuit 52, the first memory bank cooling circuit 56, the second processor cooling circuit 54, and the second memory bank cooling circuit 58. The downstream supply line branch 90 combines liquid coolant received from the first and second midstream supply line segments 78, 80 and transfers the combined liquid coolant to the downstream supply line segment 84. The downstream supply line segment 84 distributes liquid coolant to the interposer cooling circuit 66. The upstream return line segment 88 receives residual flow of the liquid coolant from the downstream supply line segment 84 and liquid coolant from the interposer cooling circuit 66. The upstream return line branch 92 distributes return line flow of the liquid coolant to the first and second midstream return line segments 94, 96. The first midstream return line segment 94 receives liquid coolant from the first riser cooling circuit 60, the motherboard cooling circuit 50, and the second riser cooling circuit 62. The second midstream return line segment 96 received liquid coolant from the first processor cooling circuit 52, the second processor cooling circuit 54, the first memory bank cooling circuit 56, and the second memory bank cooling circuit 58. The downstream return line branch combines liquid coolant received from the first and second midstream return line segments 94, 96 and supplies the combined liquid coolant to the downstream return line segment 100. The downstream return line segment 100 receives liquid coolant from the HDD cooling circuit 64, the heat exchanger 46, and the PDB cooling circuit 68. The downstream return line segment 100 supplies the return line liquid coolant flow to the heat exchanger 44. The heat exchanger 44 receives a flow of external liquid coolant and transfers heat to the flow of external liquid coolant to cool the liquid coolant prior to supplying the cooled liquid coolant to the coolant supply line 86 for recirculation through the modular cooling assembly 22. In some embodiments, the heat exchanger 44, the bubble filtration unit 42, and the pump 40 are omitted and the modular cooling assembly 22 is supplied liquid coolant from an external source into the coolant supply line 72 and returned to the external source via the coolant return line 86.

Figure 2:
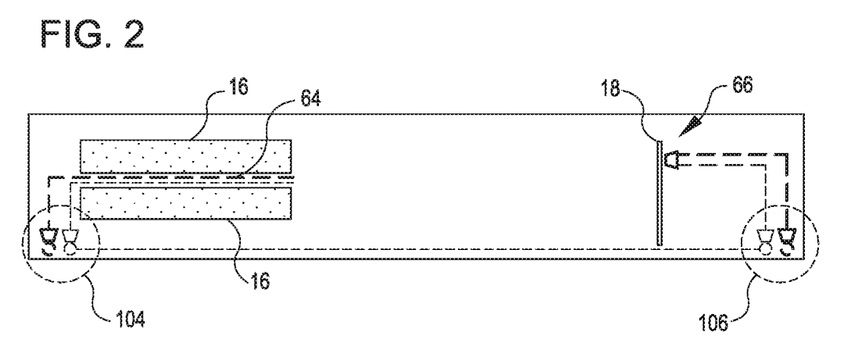
FIG. 2 is a side view schematic illustration of a hard disk drive cooling circuit and a interposer cooling circuit of the computer system of FIG. 1.

FIG. 2 is a side view schematic illustration of the hard disk drive cooling circuit 64 and the interposer cooling circuit 66 of the computer system 10. The hard disk cooling circuit 64 is coupled to the coolant supply line 70 via one of the supply-line plug-in connectors 72 and to the coolant return line 86 via one of the return-line plug-in connectors 88. The hard disk cooling circuit 64 is coupled to the coolant supply line 70 and the coolant return line 86 at a first perimeter location 104 of the chassis 12. The hard disk cooling circuit 64 receives a flow of the liquid coolant from the coolant supply line 70 and transfers heat from the HDD 16 into the liquid coolant. The hard disk cooling circuit 64 outputs the heated flow of liquid coolant to the coolant return line 86. The interposer cooling circuit 66 is coupled to the coolant supply line 70 via one of the supply-line plug-in connectors 72 and to the coolant return line 86 via one of the return-line plug-in connectors 88. The interposer cooling circuit 64 is coupled to the coolant supply line 70 and the coolant return line 86 at a second perimeter location 106 of the chassis 12. In the illustrated embodiment, the second perimeter location 106 is disposed on a side of the chassis 12 opposite to the first perimeter location 104. The interposer cooling circuit 66 received a flow of the liquid coolant from the coolant supply line 70 and transfers heat from the interposer 18 into the liquid coolant. The interposer cooling circuit 66 outputs the heated flow of liquid coolant to the coolant return line 86.

Figure 3:
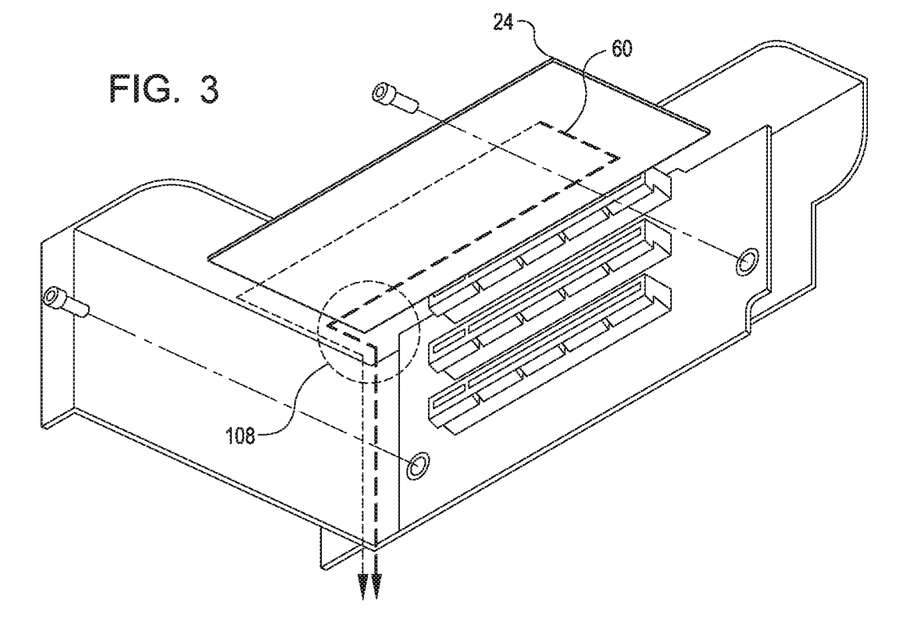
FIG. 3 is an isometric view schematic illustration of a riser and card cooling circuit of the computer system of FIG. 1.

FIG. 3 is an isometric view schematic illustration of the first riser cooling circuit 60 of the modular cooling assembly 22. The first riser cooling circuit 60 is coupled to the coolant supply line 70 via one of the supply-line plug-in connectors 72 and to the coolant return line 86 via one of the return-line plug-in connectors 88. The first riser cooling circuit 60 is coupled to the coolant supply line 70 and the coolant return line 86 at a third perimeter location 108 of the chassis 12. The first riser cooling circuit 60 receives a flow of the liquid coolant from the coolant supply line 70 and transfers heat from the first riser circuit card 24 into the liquid coolant. The first riser cooling circuit 64 outputs the heated flow of liquid coolant to the coolant return line 86.

Figures 4, 5:
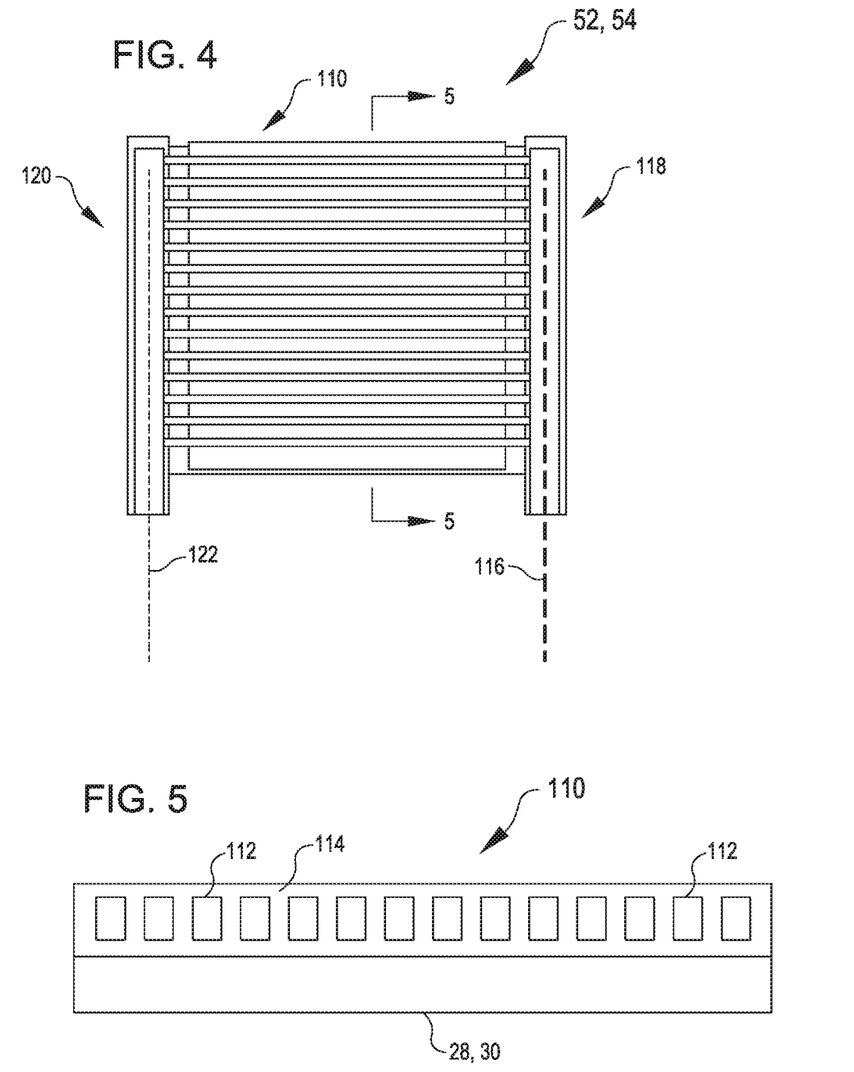
FIG. 4 is a plan view illustration of a microchannel cooler of the computer system of FIG. 1.
FIG. 5 is a cross-sectional view illustration of the microchannel cooler of FIG. 5.

The cooling circuits can include any suitable heat exchanging element configured to transfer heat from the component being cooled into the liquid coolant circulated through the cooling circuit. For example, FIG. 4 is a plan view illustration of a microchannel cooler 110 of the modular cooling assembly 22. The microchannel cooler 110 can be used to in a cooling circuit used to remove heat from components of the computer system 10 that have a relatively small surface area and generate a relatively large amount of heat. For example, each of the first processor cooling circuit 52 and a second processor cooling circuit 54 can include a respective instance of the microchannel cooler 110 to remove heat from the respective processing unit 28, 30. The microchannel cooler 110 can be interfaced with a suitable side surface of a component of the computer system 10. For example, FIG. 5 is a cross-sectional view illustration of the microchannel cooler 110 as interfaced with each of the processing units 28, 30. The microchannel cooler 110 includes an array of microchannels 112 that extend through a conductive body 114 between opposite sides of the conductive body 114. Each of the first and second processor cooling circuits 52, 54 can include an inlet coolant line 116, an inlet manifold 118, an instance of the microchannel cooler 110, an outlet manifold 120, and an outlet coolant line 122. The inlet coolant line 116 is coupled to the coolant supply line 70 via one of the supply-line plug-in connectors 72. The inlet coolant line 116 receives a flow of the liquid coolant from the coolant supply line 70 and supplies the flow of the liquid coolant to the inlet manifold 118. The inlet manifold 118 distributes the flow of the liquid coolant to the microchannels 112. A respective portion of the flow of the liquid coolant flows through each of the microchannels 112 to the outlet manifold 120. The outlet manifold 120 combines the flows of the liquid coolant received from the microchannels 112 and supplies the combined flow to the outlet coolant line 122. The outlet coolant line 122 is coupled to the coolant return line 86 via a respective one of the return-line plug-in connectors 88. Heat generated the respective processing unit 28, 30 is transferred to the liquid coolant flowing through the microchannels 112 via heat conduction through the conductive body 114.

Figure 6:
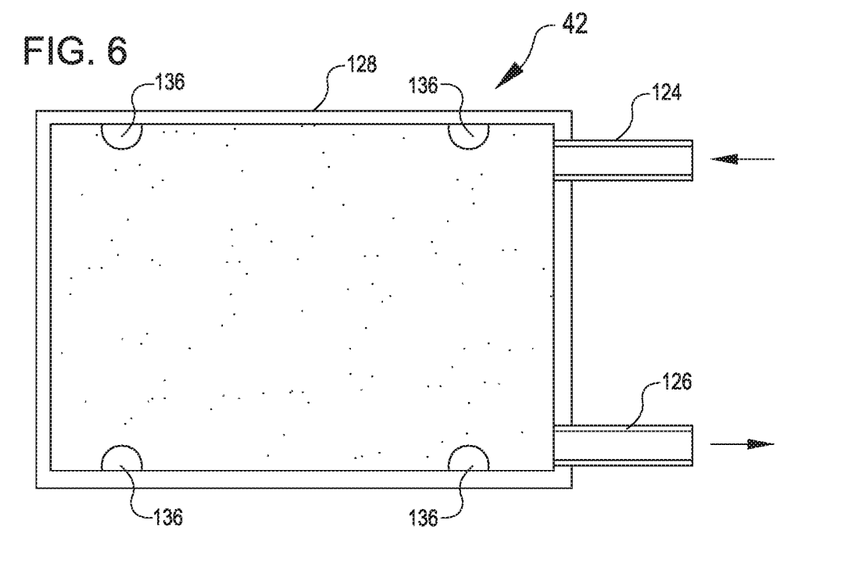
FIG. 6 is a plan view illustration of a filtration unit for removing bubbles from liquid coolant in the modular cooling assembly of the computer system of FIG. 1.
Figure 7:
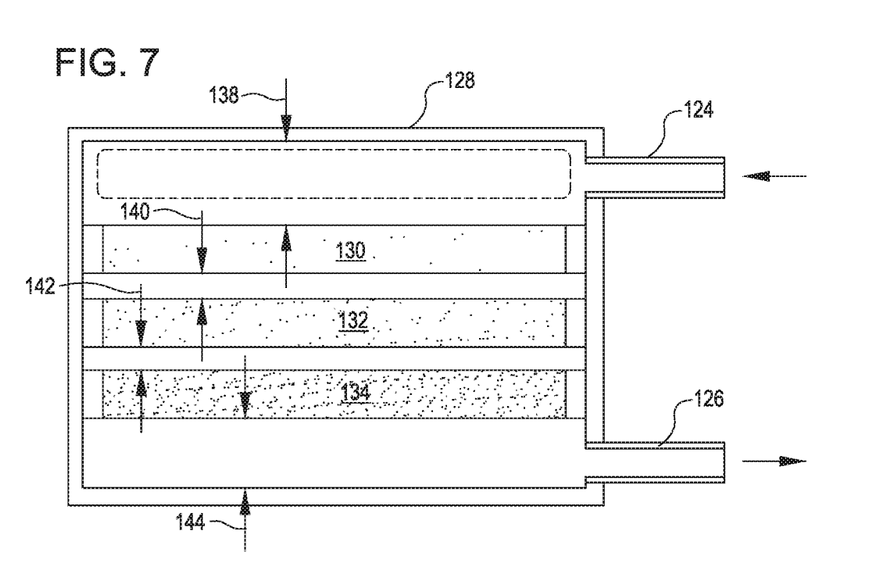
FIG. 7 is a side view illustration of the filtration unit of FIG. 7.

FIG. 6 is a plan cross-sectional view illustration of an example embodiment of the bubble filtration unit 42 of the modular cooling assembly 22. FIG. 7 is a side cross-sectional view of the bubble filtration unit 42. The bubble filtration unit 42 is fluidly coupled to the coolant supply line 70 upstream from the liquid pump 40. The bubble filtration unit 42 is configured to remove bubbles from the liquid coolant flowing through the coolant supply line 70 prior to the liquid coolant being pumped by the liquid pump 40. The bubble filtration unit 42 includes a flow inlet 124, a flow outlet 126, a housing 128, a course pore foam layer 130, an intermediate size pore foam layer 132, a fine pore foam layer 134, and air/gas vents 136. The coarse pore foam layer 130 is separated from a top wall of the housing 128 by an overlying space 138. The coarse pore foam layer 130 is separated from the intermediate pore foam layer 132 by a first intervening gap 140. The intermediate pore foam layer 132 is separated from the fine pore foam layer 134 by a second intervening gap 142. The fine pore foam layer 134 is separated from a bottom wall of the housing 128 by an underlying space 144. Each of the overlying space 138, the first intervening gap 140, the second intervening gap 142, and the underlying space 144 is in fluid communication with the air/gas vents 136.

In operation, the liquid coolant flow received via the flow inlet 124 can include air/gas bubbles that are filtered out of the liquid coolant flow by the bubble filtration unit 42. The liquid coolant first flows through the coarse pore foam layer 130, which is configured to filter larger bubbles out of the liquid coolant flow. The liquid coolant then flows through the intermediate foam pore layer 132, which is configured to filter intermediate size bubbles out of the liquid coolant flow. The liquid coolant then flows through the fine pore foam layer 134, which is configured to filter small size bubbles out of the liquid coolant flow. The resulting filtered liquid coolant flow then flows out of the flow outlet 126 and onto the liquid pump 40 via the coolant supply line 70. The air/gas vents 136 can be coupled to a suitable air/gas vent assembly configured to vent air/gas while preventing escape of any significant quantity of the liquid coolant. In some embodiments, the thicknesses of each of the course pore foam layer 130, the intermediate pore foam layer 132, and the fine pore foam layer 134 are different and selected to accommodate the same flow rate of liquid coolant through the respective foam layer.

Figure 8:
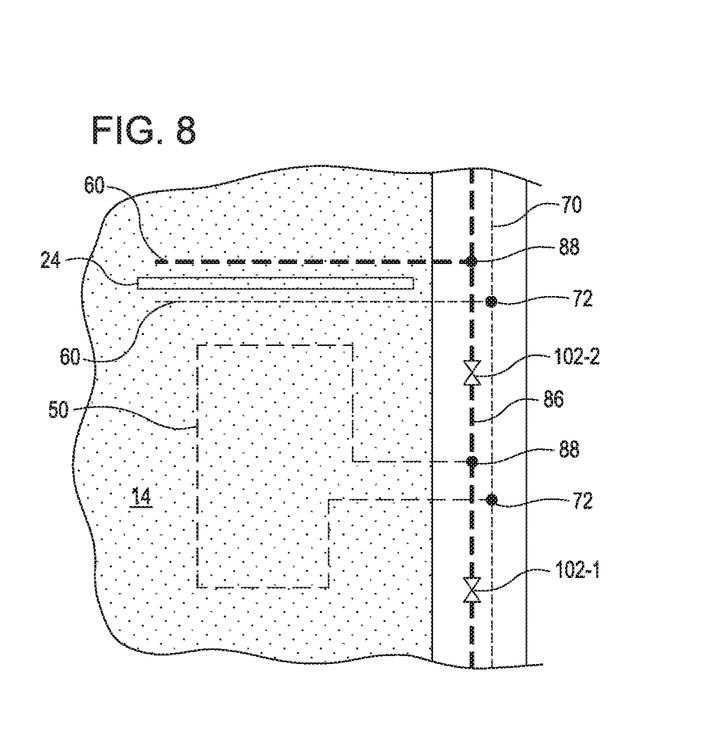
FIG. 8 is a plan view illustration of pressure and flow rate control components of the modular cooling assembly of the computer system of FIG. 1.

FIG. 8 is a plan view illustration of a portion of the modular cooling assembly 22 for use in describing operation of the flow rate control valves 102. The illustrated portion of the modular cooling assembly 22 includes a portion of the motherboard 14, the first riser circuit card 24, the first riser cooling circuit 60, the motherboard cooling circuit 50, a portion of the coolant supply line 70, a portion of the coolant return line 86, two of the supply-line plug-in connectors 72, two of the return-line plug-in connectors 88, and two of the flow rate control valves 102. The two flow rate control valves 102 shown include flow rate control valves 102-1, 102-2. Flow rate control valve 102-1 is coupled to the coolant return line 86 upstream of the return-line plug-in connector 88 for the motherboard cooling circuit 50. Flow rate control valve 102-2 is coupled to the coolant return line 86 between the return-line plug-in connectors 88 for the mother board cooling circuit 50 and the first riser cooling circuit 60. In operation, the respective flow rate of the liquid coolant though each of the cooling circuits (e.g., the illustrated motherboard cooling circuit 50) is controlled indirectly by controlling the flow rate of the liquid coolant through the associated upstream flow rate control valve (e.g., flow rate control valve 102-1 for the motherboard cooling circuit 50) and the flow rate of the liquid coolant through the associated downstream flow rate control valve (e.g., flow rate control valve 102-2 for the motherboard cooling circuit 50).

FIG. 9 is a side view illustration of one of the plug-in connectors 72, 88 in a coupled configuration. Each of the plug-in connectors includes a male connector 146 and a female connector 148. In many embodiments, the female connector 148 is serially coupled with either the coolant supply line 70 or the coolant return line 86 and includes a check-valve that prevents escape of fluid when not coupled to one of the cooling circuits via the male connector 146. Any suitable plug-in connectors 72, 88 can be employed.

Figure 10:
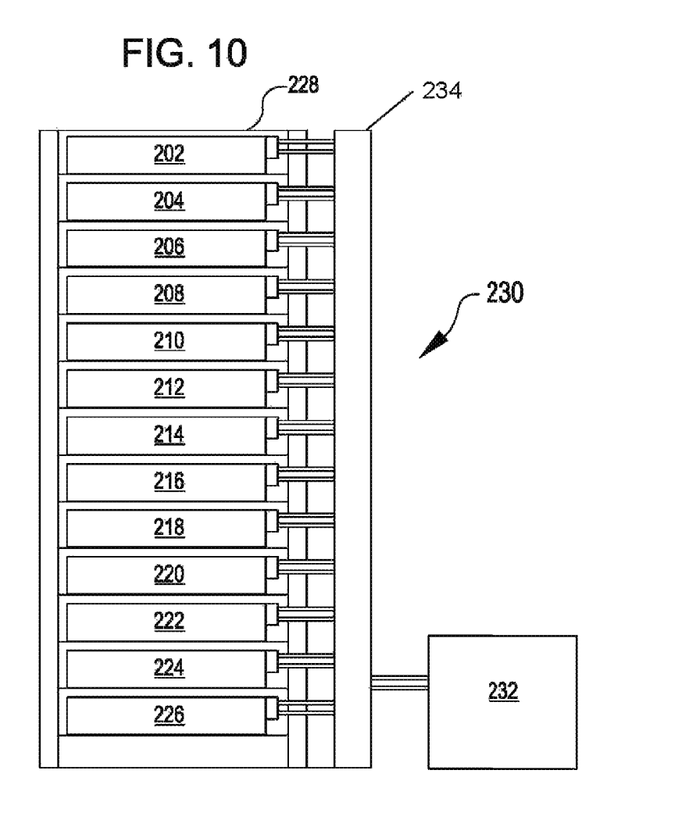
FIG. 10 is a side view schematic illustration of electronic units vertically arranged within a server cabinet with a modular cooling assembly for cooling electronic components of the electronic units, in accordance with embodiments.

FIG. 10 is a side view schematic illustration of electronic units 202 through 226 vertically arranged within a server cabinet 228 with a modular cooling assembly 230 for cooling electronic components of the electronic units, in accordance with embodiments. The modular cooling assembly 230 includes a cooling unit 232 and a distribution manifold 234. The cooling unit 232 is operable to chill and recirculate liquid coolant. Each of the electronic units 202 through 226 include an instance of the modular cooling assembly 22. In the illustrated embodiment, the cooling unit 232 supplies chilled liquid coolant to each of the modular cooling assemblies 22 via a coolant supply portion of the distribution manifold 234. The cooling unit 232 receives heated liquid coolant back from each of the modular cooling assemblies 22 via a coolant return portion of the distribution manifold 234. The cooling unit 232 chills the received heated coolant, and recirculates the chilled liquid coolant back to the modular cooling assemblies 22 via the coolant supply portion of the distribution manifold 234.

In many embodiments described herein, the modular cooling assemblies and cooling approaches are presented in the context of a computer system and/or datacenter electronic components. The modular cooling assemblies and cooling approaches of the present disclosure, however, can be employed to cool any suitable electronic system having multiple electronic components to cool the electronic components.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A modular cooling system, comprising:
   a liquid coolant supply line assembly comprising a coolant supply line configured to receive and convey a liquid coolant, wherein the coolant supply line comprises an upstream supply line segment, an upstream supply line branch, a first midstream supply line segment, a second midstream supply line segment, a downstream supply line branch, and a downstream supply line segment, wherein the upstream supply line branch divides the liquid coolant to the first midstream supply line segment and the second midstream supply line segment, and wherein the downstream supply line branch combines the liquid coolant received from the first midstream supply line segment with the liquid coolant received from the second midstream supply line segment and supplies a first combined flow of the liquid coolant to the downstream supply line segment;
   a liquid coolant return line assembly comprising a coolant return line configured to receive and convey the liquid coolant, wherein the coolant return line comprises an upstream return line segment, an upstream return line branch, a first midstream return line segment, a second midstream return line segment, a downstream return line branch, and a downstream return line segment, wherein the upstream return line segment is configured to receive the first combined flow of the liquid coolant from the downstream supply line segment, wherein the upstream return line branch divides the liquid coolant to the first midstream return line segment and the second midstream return line segment, and wherein the downstream return line branch combines the liquid coolant received from the first midstream return line segment with the liquid coolant received from the second midstream return line segment and supplies a second combined flow of the liquid coolant to the downstream return line segment;
   a first cooling loop configured to receive a first flow of the liquid coolant from the first midstream supply line segment, convey the first flow of the liquid coolant through the first cooling loop to cool a first electronic component, and output the first flow of the liquid coolant to the first midstream return line segment; and
   a second cooling loop configured to receive a second flow of the liquid coolant from the second midstream supply line segment, convey the second flow of the liquid coolant through the second cooling loop to cool a second electronic component, and output the second flow of the liquid coolant to the second midstream return line segment.

2. The modular cooling system of claim 1, further comprising:
   a heat exchanger for removing heat from the liquid coolant, wherein the heat exchanger receives a flow of the liquid coolant from the coolant return line and outputs the flow of the liquid coolant to the coolant supply line; and
   a pump for circulating the liquid coolant.

3. The modular cooling system of claim 1, further comprising a filtration unit for removing bubbles from the liquid coolant.

4. The modular cooling system of claim 3, wherein:
   the filtration unit comprises a flow inlet, a flow outlet, a housing, a first filter element, a second filter element, and a gas vent;
   the first filter element is separated from a top wall of the housing by an overlying space;
   the second filter element is separated from the first filter element by an intervening space;
   the second filter element is separated from a bottom wall of the housing by an underlying space; and
   each of the overlying space, the intervening space, and the underlying space is in fluid communication with the gas vent.

5. The modular cooling system of claim 1, further comprising a flow rate control component configurable to control a first flow rate of the first flow of the liquid coolant through the first cooling loop or a second flow rate of the second flow of the liquid coolant through the second cooling loop.

6. The modular cooling system of claim 1, further comprising:
   a first temperature sensor configured to output a first temperature signal indicative of a temperature of the first electronic component;
   a first flow rate control device controllable to control a first flow rate of the first flow of the liquid coolant through the first cooling loop; and
   a control unit that receives the first temperature signal and controls the first flow rate control device to control the temperature of the first electronic component by controlling the first flow rate of the first flow of the liquid coolant through the first cooling loop.

7. The modular cooling system of claim 6, further comprising:
   a second temperature sensor configured to output a second temperature signal indicative of a temperature of the second electronic component; and
   a second flow rate control device controllable to control a second flow rate of the second flow of the liquid coolant through the second cooling loop,
   wherein the control unit receives the second temperature signal and controls the second flow rate control device to control the temperature of the second electronic component by controlling the second flow rate of the second flow of the liquid coolant through the second cooling loop.

8. The modular cooling system of claim 1, further comprising:
   a first chassis that supports the liquid coolant supply line assembly, the liquid coolant return line assembly, the first cooling loop, the first electronic component, the second cooling loop, and the second electronic component;
   a second chassis;
   a second liquid coolant supply line assembly supported by the second chassis, wherein the second liquid coolant supply line assembly comprises a second coolant supply line configured to receive and convey the liquid coolant;
   a third electronic component and a third cooling loop;
   wherein the third cooling loop is configured to receive a third flow of the liquid coolant from the second coolant supply line and convey the third flow of the liquid coolant through the third cooling loop to transfer heat from the third electronic component into the liquid coolant;

a fourth electronic component and a fourth cooling loop; and wherein the fourth cooling loop is configured to receive a fourth flow of the liquid coolant from the second coolant supply line and convey the fourth flow of the liquid coolant through the fourth cooling loop to transfer heat from the fourth electronic component into the liquid coolant; and a second liquid coolant return line assembly supported by the second chassis and comprising a second coolant return line, wherein the second coolant return line is configured to receive the third flow of the liquid coolant from the third cooling loop, and wherein the second coolant return line is configured to receive the fourth flow of the liquid coolant from the fourth cooling loop.

9. A method of cooling components of an electronic system, the method comprising:
conveying a liquid coolant through an upstream supply line segment of a coolant supply line assembly to an upstream supply line branch of the coolant supply line assembly;
dividing, via the upstream supply line branch, the liquid coolant to a first midstream supply line segment of the coolant supply line assembly and a second midstream supply line segment of the coolant supply line assembly;
combining, via a downstream supply line branch of the coolant supply line assembly, the liquid coolant from the first midstream supply line segment with the liquid coolant from the second midstream supply line segment;
conveying the liquid coolant combined by the downstream supply line branch through a downstream supply line segment of the coolant supply line assembly;
conveying the liquid coolant from the downstream supply line segment to an upstream return line segment of a coolant return line assembly;
conveying the liquid coolant through the upstream return line segment to an upstream return line branch of the coolant return line assembly;
dividing, via the upstream return line branch, the liquid coolant to a first midstream return line segment of the coolant return line assembly and a second midstream return line segment of the coolant return line assembly;
diverting a first flow of the liquid coolant from the first midstream supply line segment through a first cooling loop and into the first midstream return line segment;
transferring, via the first cooling loop, heat from a first electronic component into the first flow of the liquid coolant;
diverting a second flow of the liquid coolant from the second midstream supply line segment through a second cooling loop and into the second midstream return line segment; and
transferring, via the second cooling loop, heat from a second electronic component into the second flow of the liquid coolant, wherein the second electronic component is different from the first electronic component.

10. The method of claim 9, further comprising:
generating, via a first temperature sensor, a first temperature signal indicative of a temperature of the first electronic component; and
controlling a first flow rate control device based on the first temperature signal, by a control unit, to control a rate of the first flow of the liquid coolant through the first cooling loop to control the temperature of the first electronic component.

11. The method of claim 9, further comprising:
combining, via a downstream return line branch of the coolant return line assembly, the liquid coolant from the first midstream return line segment with the liquid coolant from the second midstream return line segment; and
conveying the liquid coolant combined by the downstream return line branch through a downstream return line segment of the coolant return line assembly.

12. The method of claim 9, further comprising cooling the liquid coolant by heating a flow of air passing through a heat exchanger.

13. A modular cooling system, comprising:
a liquid coolant supply line assembly comprising a coolant supply line configured to receive and convey a liquid coolant;
a liquid coolant return line assembly comprising a coolant return line configured to receive and convey the liquid coolant;
a first cooling loop in fluid communication with the coolant supply line to convey the liquid coolant through the first cooling loop to cool a first electronic component, wherein the coolant return line is in fluid communication with the first cooling loop to receive the liquid coolant from the first cooling loop;
a second cooling loop in fluid communication with the coolant supply line to convey the liquid coolant through the second cooling loop to cool a second electronic component, wherein the coolant return line is in fluid communication with the second cooling loop to receive the liquid coolant from the second cooling loop; and
a filtration unit for removing bubbles from the liquid coolant, wherein the filtration unit comprises a flow inlet, a flow outlet, a housing, a first filter element, a second filter element, and a gas vent; wherein the first filter element is separated from a top wall of the housing by an overlying space, wherein the second filter element is separated from the first filter element by an intervening space, wherein the second filter element is separated from a bottom wall of the housing by an underlying space, and wherein each of the overlying space, the intervening space, and the underlying space is in fluid communication with the gas vent.

14. The modular cooling system of claim 13, further comprising:
a heat exchanger for removing heat from the liquid coolant, wherein the coolant supply line is in fluid communication with the coolant return line via the heat exchanger; and
a pump for circulating the liquid coolant.

15. The modular cooling system of claim 13, further comprising a flow rate control component configurable to control a flow rate of the liquid coolant through the first cooling loop or the second cooling loop.

16. The modular cooling system of claim 13, further comprising:
a first temperature sensor configured to output a first temperature signal indicative of a temperature of the first electronic component;
a first flow rate control device controllable to control a rate of flow of the liquid coolant through the first cooling loop; and
a control unit that receives the first temperature signal and controls the first flow rate control device to control the temperature of the first electronic component by controlling the rate of flow of the liquid coolant through the first cooling loop.

17. The modular cooling system of claim 13, further comprising:
- a first chassis that supports the liquid coolant supply line assembly, the liquid coolant return line assembly, the first cooling loop, the first electronic component, the second cooling loop, and the second electronic component;
- a second chassis;
- a second liquid coolant supply line assembly supported by the second chassis, wherein the second liquid coolant supply line assembly comprises a second coolant supply line configured to receive and convey the liquid coolant;
- a third electronic component and a third cooling loop; wherein the third cooling loop is in fluid communication with the second coolant supply line to convey the liquid coolant through the third cooling loop to transfer heat from the third electronic component into the liquid coolant;
- a fourth electronic component and a fourth cooling loop; and wherein the fourth cooling loop is in fluid communication with the second coolant supply line to convey the liquid coolant through the fourth cooling loop to transfer heat from the fourth electronic component into the liquid coolant; and
- a second liquid coolant return line assembly supported by the second chassis and comprising a second coolant return line, wherein the second coolant return line is in fluid communication with the third cooling loop to receive the liquid coolant from the third cooling loop, and wherein the second coolant return line is in fluid communication with the fourth cooling loop to receive the liquid coolant from the fourth cooling loop.

* * * * *